US006258656B1

(12) United States Patent
Lange et al.

(10) Patent No.: US 6,258,656 B1
(45) Date of Patent: Jul. 10, 2001

(54) CAPACITOR WITH HIGH-$\epsilon$ DIELECTRIC OR FERROELECTRIC MATERIAL BASED ON THE FIN STACK PRINCIPLE AND PRODUCTION PROCESS USING A NEGATIVE MOLD

(75) Inventors: Gerrit Lange; Till Schlösser, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/395,316

(22) Filed: Sep. 13, 1999

(30) Foreign Application Priority Data

Sep. 17, 1998 (DE) .............................. 198 42 704

(51) Int. Cl.[7] .............................. H01L 21/8242
(52) U.S. Cl. .............................. 438/240; 438/3
(58) Field of Search .............................. 438/3, 240, 253, 438/396, 785

(56) References Cited

U.S. PATENT DOCUMENTS

| 5,581,436 | * | 12/1996 | Summerfelt et al. | 438/3 |
| 5,663,088 | * | 9/1997 | Sandhu et al. | 438/240 |
| 5,786,248 | * | 7/1998 | Schuegraf | 438/240 |
| 6,097,051 | * | 8/2000 | Torii et al. | 438/240 |

* cited by examiner

*Primary Examiner*—Chandra Chaudhari
(74) *Attorney, Agent, or Firm*—Herbert L. Lerner; Laurence A. Greenberg; Werner H. Stemer

(57) ABSTRACT

A capacitor on a semiconductor configuration is formed with a high-$\epsilon$ dielectric or a ferroelectric material. A first noble-metal-containing storage electrode has a plurality of horizontal lamellae connected to one another via a support structure. The support structure is arranged on one or preferably two opposite external flanks of the lamellae. During production, firstly (inter alia by deposition of a sequence of layers with an alternating low and high etching rate) a fin stack negative mold, in particular made from $p^+$-polysilicon, is formed, which is then filled conformally with the electrode material.

10 Claims, 5 Drawing Sheets

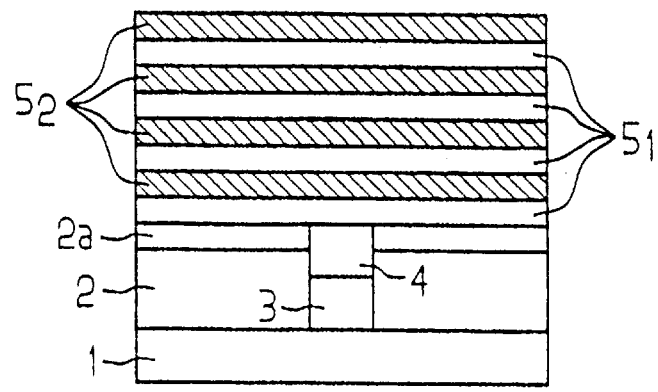
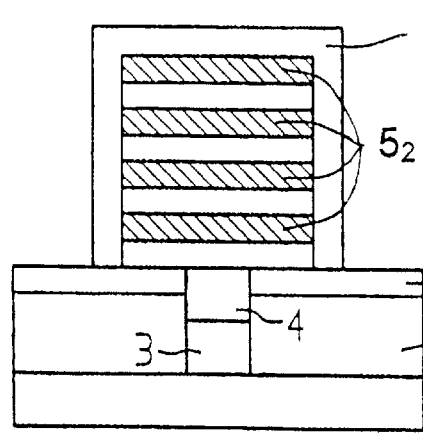
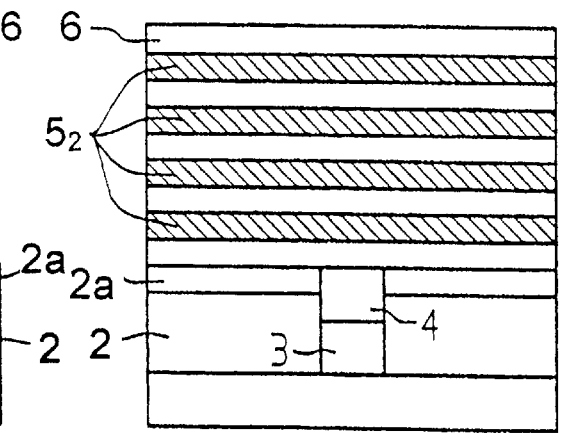
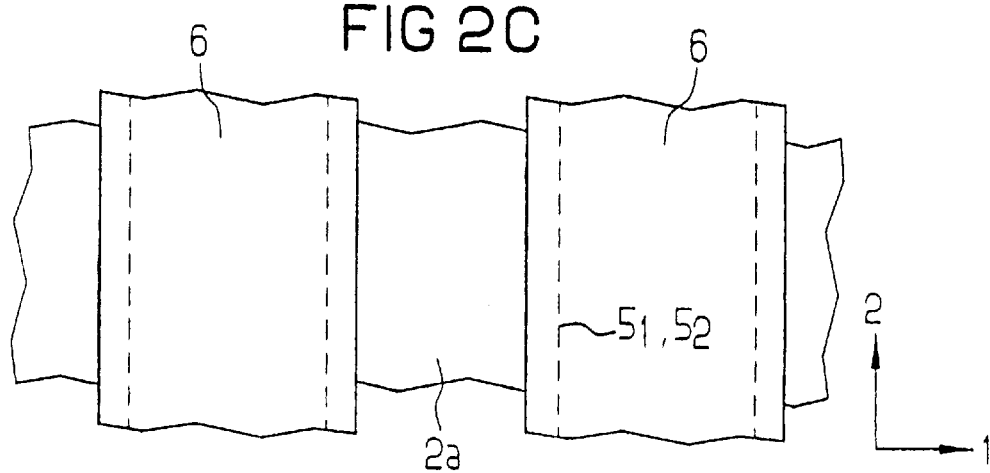

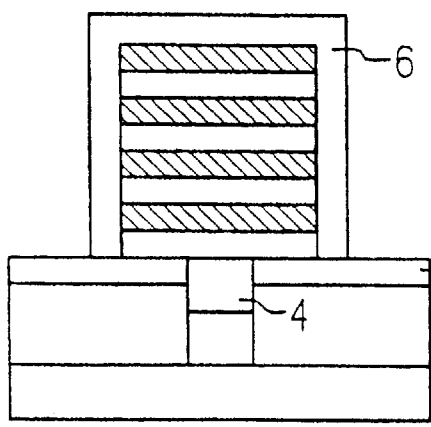
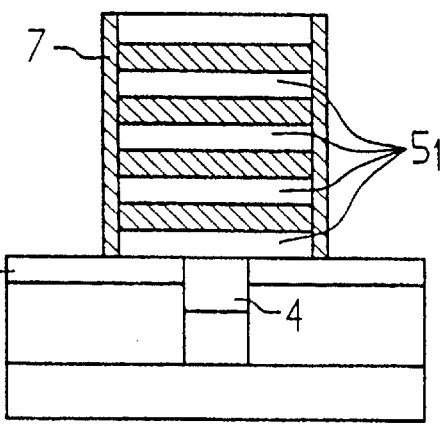
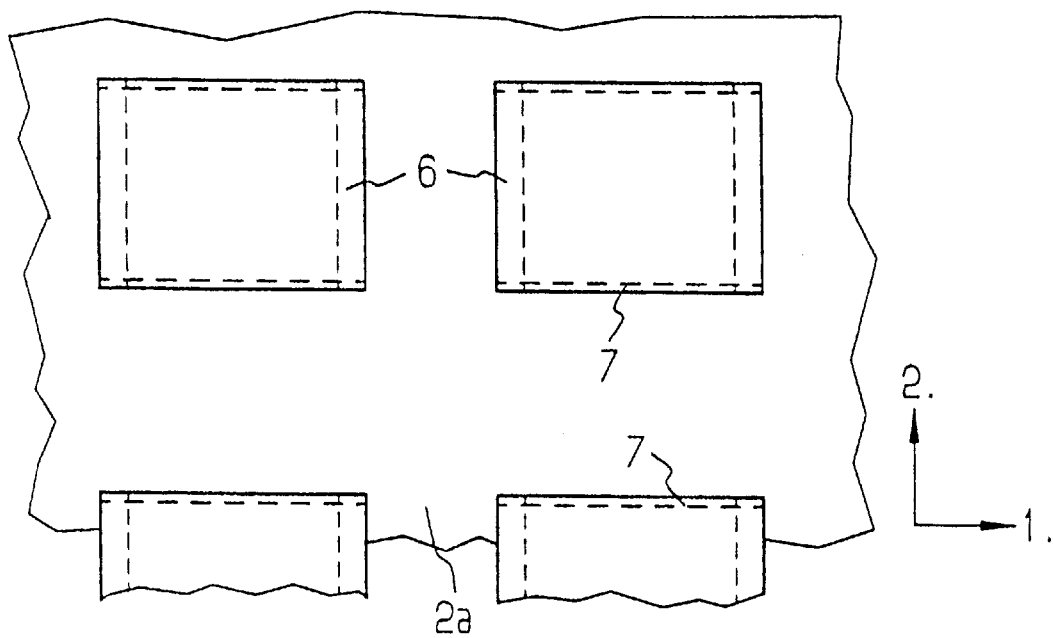

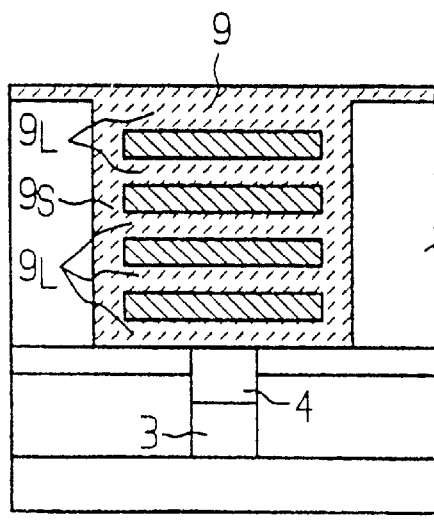
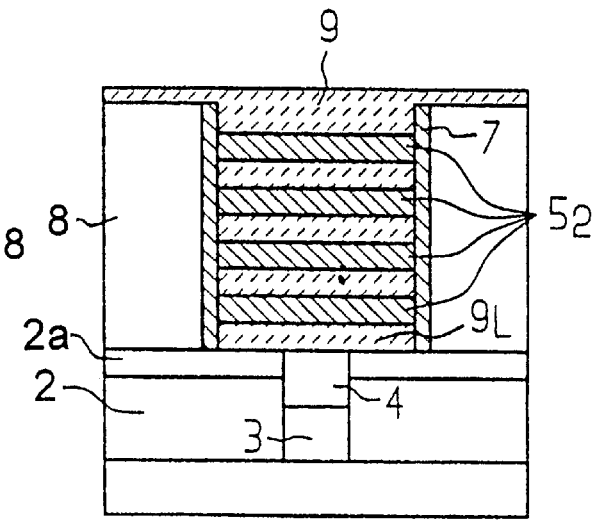
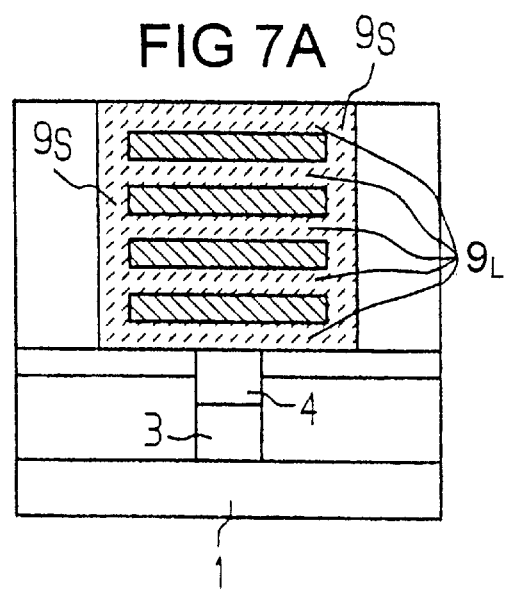
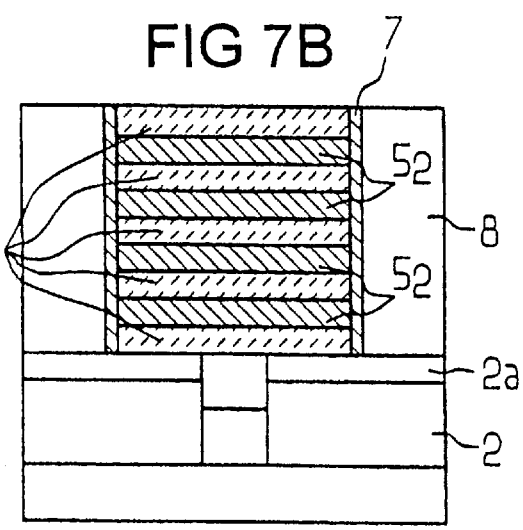

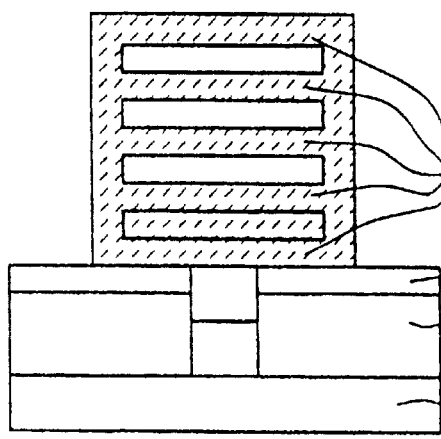
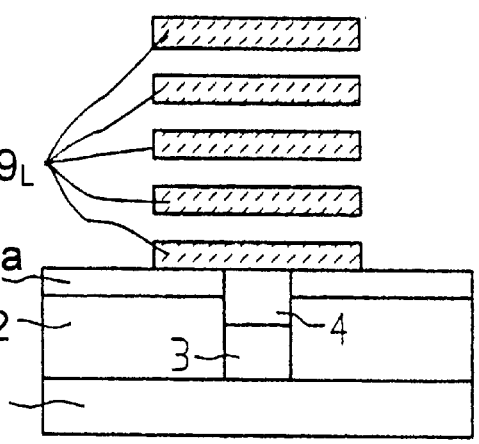
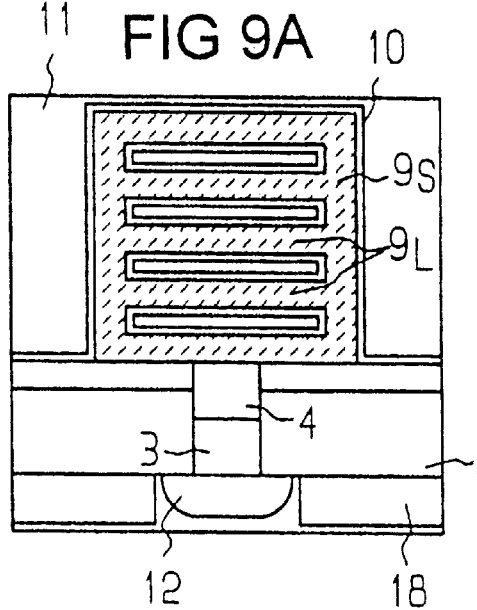
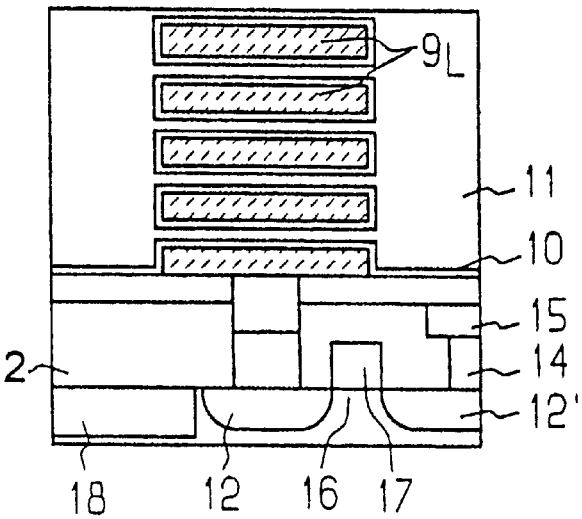

CAPACITOR WITH HIGH-ε DIELECTRIC OR FERROELECTRIC MATERIAL BASED ON THE FIN STACK PRINCIPLE AND PRODUCTION PROCESS USING A NEGATIVE MOLD

BACKGROUND OF THE INVENTION

Field of the Invention

The invention relates to a capacitor in an integrated circuit having a noble-metal-containing first electrode, in which a high-ε dielectric material or a ferroelectric material is used as the capacitor dielectric, and to a process for producing such a capacitor.

Capacitors are required in a large number of semiconductor integrated circuits, for example in DRAM circuits or A/D converters. A primary aim in this context is to increase the integration density, i.e. it is necessary to achieve as high a capacitance as possible, or a capacitance which is sufficient for the requirements, with a minimum amount of space. The problem presents itself in particular in DRAM circuits, in which each memory cell has a storage capacitor and a selection transistor, while the area available for a memory cell is being constantly reduced. At the same time, in order for the charge to be reliably stored and for it to be possible to distinguish between the information to be read, it is necessary to maintain a certain minimum capacitance of the storage capacitor. This minimum capacitance is currently regarded as being approximately 25 fF.

To reduce the space required for a capacitor, it is possible to use a paraelectric material with a high permittivity (high-ε dielectric material) as the capacitor dielectric. In memory configurations such capacitors are preferably employed as so-called stacked capacitors (the capacitor of the cell is arranged above the associated selection transistor). Memory cells which use paraelectric material as the capacitor dielectric lose their charge when the supply voltage is selected, and thus lose their stored information. Furthermore, owing to the residual leakage current, these cells have to be constantly rewritten (refresh time). By contrast, the use of a ferroelectric material as the capacitor dielectric, owing to the different polarization directions of the ferroelectric material, makes it possible to construct a nonvolatile memory (FRAM), which does not lose its information when the supply voltage is selected and also does not have to be constantly rewritten. The residual leakage current of the cell does not affect the stored signal.

Various high-ε dielectric materials and ferroelectric materials are known from the literature, for example barium strontium titanate (BST), strontium titanate (ST) or lead zirconium titanate (PZT), as well as ferroelectric and paraelectric polymers, and other materials.

Although these materials do have the desired electrical properties, their significance in practice still remains limited. A principal reason for this is that the materials cannot be readily employed in semiconductor configurations. The materials are produced by means of a sputter-on or deposition process which requires high temperatures in an oxygen-containing atmosphere. Consequently, the conductive materials (e.g. polysilicon, aluminum, or tungsten) used in the semiconductor industry as electrode material are unsuitable, since they are oxidized under such conditions. Therefore, at least the first electrode is usually made from a noble-metal-containing material, such as platinum or ruthenium. However, these new electrode materials are relatively unknown substances in the semiconductor industry and are relatively difficult to apply. A particularly serious problem is that they can only be structured satisfactorily with a thin layer thickness. Furthermore, they are permeable to oxygen, with the result that, during the production of the capacitor dielectric, deep structures become oxidized and satisfactory contact between the first electrode and selection transistor is not guaranteed. Therefore, a barrier which suppresses oxygen diffusion is required beneath the capacitor dielectric.

German published patent application DE 196 40 448 and published International Application WO 98/14992 describe a memory cell of this type, in which the barrier between the first electrode and the connection structure for the selection transistor is formed over the entire surface by nitriding. German published patent application DE 196 40 244 describes a capacitor with a high-ε dielectric or ferroelectric capacitor dielectric, in which the first electrode comprises an electrode core and a comparatively thin noble-metal-containing layer, and in which the electrode core comprises the material of the connection structure or of the oxidation barrier. This has the advantage that only a thin noble-metal-containing layer has to be structured.

A common feature of all these capacitors having a high-ε dielectric or ferroelectric capacitor dielectric is that the first electrode is provided in essentially planar configuration.

In U.S. Pat. No. 5,581,436, a thin layer of platinum is applied to the surface of an electrode core, as the first electrode of a capacitor of the type in question. If appropriate, the high-ε dielectric may be produced as an exposed structure prior to the formation of the first and second electrodes, i.e. the electrodes are then formed on the side walls of the dielectric.

SUMMARY OF THE INVENTION

It is accordingly an object of the invention to provide a in a capacitor with a high-ε dielectric or ferroelectric capacitor dielectric, which overcomes the above-mentioned disadvantages of the heretofore-known devices and methods of this general type and which leads to a further reduction in the space requirement, and a process for producing such a capacitor which is compatible with standard production processes.

With the foregoing and other objects in view there is provided, in accordance with the invention, a process for producing a capacitor in a semiconductor configuration on a substrate, which comprises:

forming a sequence of layers on a substrate, the sequence alternately comprising a layer of a first material and a layer of a second material, wherein the first material is selectively etchable with respect to the second material;

etching the sequence of layers to form a layer structure with flanks;

forming a first auxiliary structure of a first auxiliary material covering at least one flank of the layer structure, wherein the first auxiliary structure is selectively etchable with respect to the second material;

forming a second auxiliary structure covering at least one other flank of the layer structure and mechanically connecting the layers of the second material;

covering a substrate surface surrounding the layer structure with a filler layer up to a top edge of the layer structure;

removing the layers of the first material and the first auxiliary structure selectively with respect to the layers of the second material and with respect to the second auxiliary structure;

filling a cavity formed in the removing step with a noble-metal-containing electrode material and forming a first electrode with lamellae in the cavity formed by the layers made from the first material and with a support structure connecting the lamellae in the cavity formed by the first auxiliary structure;

removing the layers of the second material and the second auxiliary structure selectively with respect to the electrode material;

conformally applying a capacitor dielectric of a material selected from the group consisting of high-ε dielectric and ferroelectric material to an exposed surface of the first electrode; and forming a second electrode on the capacitor dielectric.

In accordance with an added feature of the invention, the first material is undoped, n-doped, and p⁻-doped polysilicon, and the second material is p⁺-doped polysilicon.

In accordance with an additional feature of the invention, the first auxiliary structure is formed on two flanks of the layer structure which lie opposite one another in a first direction.

In accordance with another feature of the invention, the second auxiliary structure is formed on two flanks of the layer structure which lie opposite one another in a second direction.

In accordance with a further feature of the invention, the first auxiliary structure and/or the second auxiliary structure are formed by selective silicon deposition.

In accordance with again an added feature of the invention, the second auxiliary structure is formed by inclined implantation with p-doping ions into the flank of the layer structure.

In accordance with again an additional feature of the invention, after the cavity is filled with the electrode material, the electrode material deposited on the filler layer is removed with a CMP process.

In accordance with again another feature of the invention, subsequently to the formation of the first electrode, the filler layer is removed selectively with respect to the electrode material and with respect to the substrate surface.

In accordance with again a further feature of the invention, the substrate is provided with an insulating layer on a surface facing toward the sequence of layers and forming the sequence of layers on the insulating layer, wherein the insulating layer has a contact arranged therein comprising a diffusion barrier connected to the first electrode.

In accordance with a concomitant feature of the invention, the process is directed to producing a multiplicity of capacitors in a linear arrangement along a second direction on the substrate. The following production steps are thereby performed:

structuring the sequence of layers to strip-shaped layer structures running in the second direction, with the first auxiliary structures formed on the flanks of the structures;

structuring the strip-like layer structures, together with the first auxiliary structures, to form a multiplicity of island-like layer structures;

forming the second auxiliary structures on the flanks of each island opposite one another in the second direction; and filling an entire space between the islands with the filler layer.

With the above and other objects in view there is also provided, in accordance with the invention, a capacitor in a semiconductor configuration on a substrate, comprising:

a noble-metal-containing first capacitor electrode formed with a plurality of mutually spaced-apart lamellae, the lamellae being oriented substantially parallel to the substrate surface;

a support structure mechanically and electrically connecting the lamellae to one another on a flank thereof;

a capacitor dielectric formed of a material selected from the group consisting of high-s dielectric and ferroelectric material disposed on the first capacitor electrode; and a second capacitor electrode on the capacitor dielectric.

In accordance with yet an added feature of the invention, the lamellae define two mutually opposite flanks and the support structure is arranged on the two flanks of the lamellae.

In accordance with yet an additional feature of the invention, the substrate, on a surface thereof facing toward the lamellae, is formed with an insulating layer having a contact arranged therein, the contact comprising a diffusion barrier and being connected to the first capacitor electrode.

In accordance with a concomitant feature of the invention, the substrate contains a MOS transistor and the contact connects a source-drain region of the transistor to the first electrode.

The invention may thus be summarized as follows: the first electrode comprises at least two lamellae which are spaced apart from one another, lie essentially parallel to the substrate surface and are connected to one another via a support structure. The surface which acts as a capacitor is consequently significantly larger than the substrate surface claimed. The support structure may in particular be arranged on one outer flank of the lamellae or on two opposite outer flanks.

The geometric structure of the first electrode corresponds to the form of so-called "fin stack capacitors," which comprise doped polysilicon. During the production of these known capacitors, polysilicon with a high layer thickness (composed of a plurality of individual layers) has to be anisotropically etched, as described, for example, in published European patent applications EP 756 326 A1 and EP 779 656 A2. This geometric structure does not appear to be achievable for noble-metal-containing electrodes, in view of the difficulty in etching such electrodes.

The production process according to the invention makes it possible to produce a capacitor with a noble-metal-containing first electrode based on the fin stack principle without there being any need for anisotropic etching of the electrode material. It is based on using a body which preferably comprises p⁺-polysilicon, which is similar to that of the fin stack capacitor, as a negative mold for a metal body which fulfills the specific requirements imposed on electrodes when using high-ε dielectric materials and ferroelectric materials.

To produce the first electrode, a sequence of layers which alternately has a layer made from a first material and a layer made from a second material, it being possible to etch the first material selectively with respect to the second material, is formed on a substrate which may contain an insulating layer with a connection embedded therein. The sequence of layers is then etched to form a layer structure with flanks. A first auxiliary structure is then formed on at least one flank, which structure comprises a first auxiliary material which, like the first material, can be etched selectively with respect to the second material. At least one flank is not covered by the first auxiliary structure. A second auxiliary structure is then formed, which covers at least one, and preferably all the remaining external flanks of the sequence of layers and mechanically connects the layers made from the second material. The substrate surface which surrounds this arrangement is covered with a filler layer all the way to the top edge of the layer structure. Then, the layers made from the first material and the first auxiliary structure are removed selectively with respect to the layers made from the second material and with respect to the second auxiliary structure. Thus, the filler layer and the layers made from the second material which are connected to one another by the second auxiliary structure then remain on the substrate. This structure forms a negative mold with a cavity which has been formed by the removal of the layers made from the first material and of the first auxiliary structure. The cavity is filled, all the way up to the top edge of the filler layer, with a noble-metal-containing electrode material, in order to form a first electrode. Then, the layers made from the second material and the second auxiliary structure are removed selectively with respect to the electrode material, and preferably the filler layer is also removed, in particular selectively with respect to the substrate surface. This results in a first electrode with an exposed surface, to which a capacitor dielectric made from a high-$\epsilon$ dielectric material or a ferroelectric material is then conformally applied. Finally, the second electrode is formed on the capacitor dielectric.

There are numerous possibilities for the selection of the first and second material and for the arrangement and formation of the first and second auxiliary structures. Neither the layers made from the first or second material nor the auxiliary structures remain in the finished semiconductor arrangement. They can therefore be selected according to process-engineering criteria; the electrical properties are unimportant. The first auxiliary structure preferably comprises the first material, and the second auxiliary structure preferably comprises the second material.

A suitable material for the first electrode is, in particular, platinum, although ruthenium oxide and other noble-metal-containing materials which are known for use in a high-$\epsilon$ or ferroelectric capacitor and which can be applied conformally in a cavity, for example by means of MOCVD, are also suitable. The second electrode preferably comprises the same material as the first, but may also be formed from another suitable material, such as W or TiN, another metal or doped polysilicon. The second electrode of the capacitor is separated from the first electrode by a high-$\epsilon$ dielectric material or a ferroelectric material.

The substrate may contain a connection for the first electrode, in which case the rest of the substrate surface is covered with an insulating layer. The noble-metal-containing first electrode then covers part of the substrate surface and covers over this connection, so that electrical contact is guaranteed.

Preferably, the capacitor is used in a DRAM cell. The substrate then contains the associated MOS selection transistor. An S/D region of the transistor is connected to the first electrode via the connection which has been explained above. The connection preferably has a conductive oxygen barrier (for example titanium nitride) in its upper region and otherwise comprises, for example, titanium, polysilicon, tungsten or the like.

In a preferred embodiment of the production process, the layers made from the first material comprise $p^-$-doped polysilicon or undoped polysilicon and the layers made from the second material comprise $p^+$-doped polysilicon. The first auxiliary structure may then be formed by selective silicon deposition of undoped or n- or $p^-$-doped polysilicon. The epitaxial or selectively deposited layer is then removed again on preferably two mutually opposite external flanks of the layer structure. Alternatively, particularly if it is chosen to use different first and second materials, the first auxiliary structure may also be formed as a spacer or by sidewall implantation into one or two of the layer structures. In the abovementioned layer system, the second auxiliary structure is preferably formed by lateral implantation with boron ions. Alternatively, instead of a lateral boron implantation, it is possible to carry out a selective Si deposition of $p^+$-doped polysilicon. If both auxiliary structures are formed using epitaxy, the sequence of the selective $p^+$- and $p^-$-deposition may also be reversed, i.e. the second auxiliary structure may be produced before the first auxiliary structure.

The filler layer is preferably formed by deposition of a thick layer of silicon oxide, which is subsequently ground down (CMP) to the height of the layer structure, i.e. until the first auxiliary structure or the top layer made from the first material is at least partially exposed.

Although it can be employed very generally, the capacitor and the production process are described below with reference to the example of a DRAM cell configuration.

Other features which are considered as characteristic for the invention are set forth in the appended claims.

Although the invention is illustrated and described herein as embodied in a capacitor with a high-$\epsilon$ dielectric material or a ferroelectric material based on the fin stack principle, and production process using a negative mold, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic sectional view of a capacitor stack on a substrate according to the invention;

FIGS. 2A and 2B are two mutually orthogonal, vertical sections (rotated by 90° about a vertical axis relative to one another);

FIG. 2C is a plan view onto the substrate during a first production stage;

FIGS. 3A and 3B are mutually orthogonal sections through the capacitor structure at a later production stage;

FIG. 3C is a top plan view thereof;

FIGS. 6A and 6B are two similar sections through the capacitor structure at a later production stage;

FIGS. 7A and 7B are two similar sections through the capacitor structure at a later production stage;

FIGS. 8A and 8B are two similar sections through the capacitor structure at a later production stage; and FIGS. 9A and 9B are mutually orthogonal sections through the final capacitor structure on a semiconductor configuration.

DESCRIPTION OF THE PREFERRED EMBODIMENTS

Figure 4A:
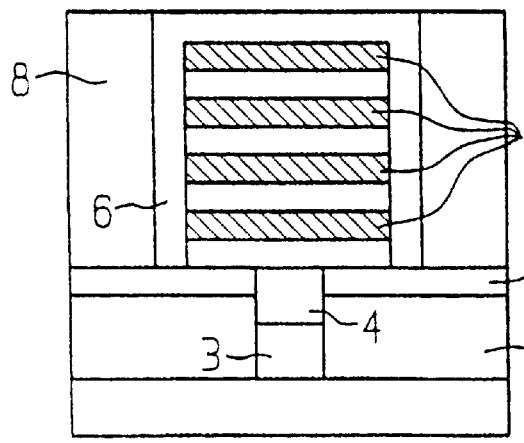
FIGS. 4A and 4B are mutually orthogonal sections through the capacitor structure at a later production stage.

Referring now to the figures of the drawing in detail and first, particularly, to FIG. 1 thereof, an insulating layer 2, which preferably comprises an etching stop layer 2a on its upper surface, is first applied to a substrate 1. The substrate 1 is, for example, a silicon substrate which comprises selection transistors with word lines and bit lines (see FIG. 9). The insulation layer is formed, for example, from silicon oxide and is planarized, and the etching stop layer 2a preferably comprises silicon nitride. Contact holes 3 are opened up in the insulating layer 2, 2a and are filled with electrically conductive material, for example with doped polysilicon, tungsten, tantalum, titanium, titanium nitride or tungsten silicide. The contact holes 3 are arranged in such a way that they in each case extend as far as a source/drain region of a selection transistor in the substrate 1. Preferably, a barrier 4 which suppresses oxygen diffusion is arranged in the upper part of the contact hole 3. Processes for producing such a barrier are known, for example, from German published patent applications DE 196 20 246 and DE 196 40 448. A sequence of layers which alternately comprises a layer $5_1$ made from a first material and a layer $5_2$ made from a second material is then applied to the surface of this substrate. Preferably, the first material comprises p$^-$-doped or undoped polysilicon, and the second material comprises p$^+$-doped polysilicon. It must be possible for the first material to be etched selectively with respect to the second material, with respect to the substrate surface 2a and with respect to the barrier material 4. The layer thicknesses preferably lie in the range from 20–100 nm. In the exemplary embodiment, second material layer forms the uppermost layer of the sequence of layers.

Next, with reference to FIGS. 2A, 2B, and 2C, strip-like layer structures 5 are formed from the sequence of layers by anisotropic etching using a mask; the strips run in a second direction (indicated in dashed lines in FIG. 2c). FIG. 2A shows the substrate in section along a first direction, while FIG. 2B shows the substrate in section in the second direction, which is perpendicular to the first direction. In the first direction, the width of a strip corresponds to the capacitor lamellae which are to be produced. Next to the layer structure $5_1$, $5_2$, the surface of the insulating layer, in this case, therefore, of the etching stop layer 2a, is exposed. Then, a layer 6, preferably made from undoped silicon or from p$^-$-doped silicon, is applied by means of selective deposition, i.e. is grown over the strip-like layer structures.

Next, with reference to FIGS. 3A, 3B, and 3C, a photoresist mask or hard mask which has strips running in the first direction is then applied. Using that etching mask, anisotropic etching of the polysilicon layers $5_1$, $5_2$, 6 is carried out, so that the silicon strips running in the second direction are separated into individual islands. These islands, which comprise the layers made from the first material $5_1$, the layers made from the second material $5_2$ and the silicon layer 6, in each case define the location and size of an individual capacitor electrode. The selective silicon layer 6 covers in each case two external flanks, which lie opposite one another in the first direction, of an island-like layer structure and constitutes the first auxiliary structure. The external flanks of the island, which lie opposite to one another in the second direction, are not covered by the first auxiliary structure, and the sequence of layers $5_1$, $5_2$ is exposed here. These external flanks $5_1$, $5_2$, 6 are then laterally implanted with boron, so that a second auxiliary structure 7 comprising p$^+$-doped silicon is formed thereon. The mask is then removed. Alternatively, instead of the implantation, a p$^+$-silicon layer may also be selectively deposited on the external flanks which lie opposite to one another in the second direction, specifically also before the mask is removed. This p$^+$-silicon layer then constitutes the second auxiliary structure 7.

Figure 4B:
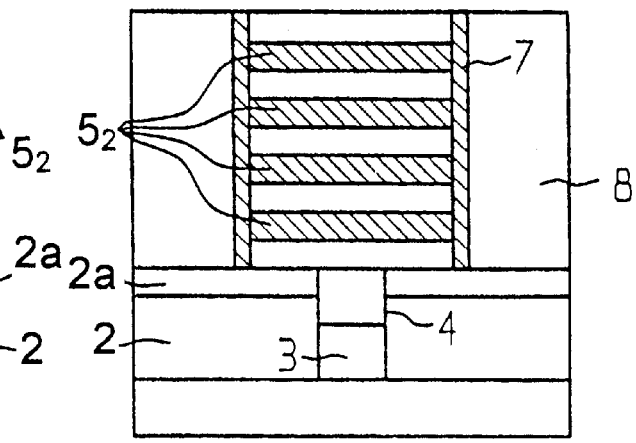

With reference to the mutually orthogonal views in FIG. 4A and FIG. 4B, the spaces between the island-like structures are filled with a filler layer 8. For this purpose, it is preferable to apply a sufficiently thick layer of silicon oxide which is then ground down to the height of the top edge of the island-like structures, in this case, therefore, of the silicon layer 6, by means of CMP (chemical mechanical polishing). The filler layer preferably comprises a material which can be etched selectively with respect to the substrate surface, in this case, therefore, with respect to the nitride etching stop layer 2a.

Figure 5A:
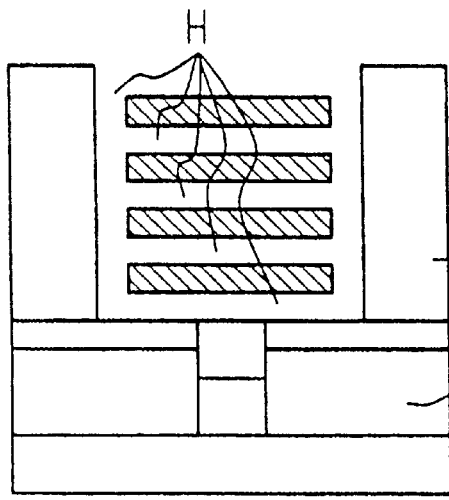
FIGS. 5A and 5B are two similar sections through the capacitor structure at a later production stage.
Figure 5B:
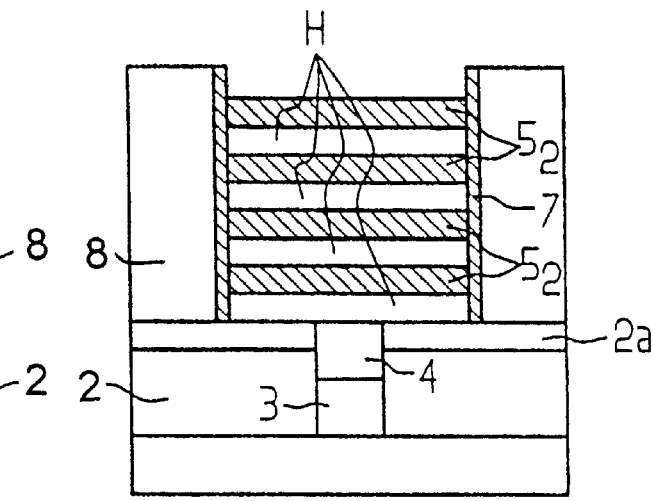

With reference to FIGS. 5A and 5B, the layers made from the first material $5_1$ and the first auxiliary structure 6, which in this case comprise p$^-$-doped silicon, are removed selectively with respect to the layers made from the second material and the second auxiliary structure 7 (p$^+$-silicon) and with respect to the filler layer 8. Suitable etching processes with an isotropic component are known to those skilled in the art. The p$^+$-doped silicon layers $5_2$ and the p$^+$-doped side walls 7 remain in place and form a ladder-like framework which, together with the filler layer, constitutes a negative mold with cavities H at the locations of the p$^-$-doped silicon layers and of the first auxiliary structure.

With reference to FIGS. 6A and 6B, the cavity H is filled conformally with an electrode material 9 which is suitable for high-ε dielectric materials or for ferroelectric materials, i.e. in particular platinum, iridium, ruthenium oxide or another noble-metal-containing material. Platinum may, for example, be applied conformally by means of MOCVD. In the process, platinum is also deposited on the filler layer 8.

With reference to FIGS. 7A and 7B, the electrode material located on the filler layer 8 is removed by means of CMP or the etchback process. As a result, the first electrode of the capacitor, which comprises lamellae 9L which are spaced apart from one another and lateral support structures 9S, is completed. At the same time, the electrodes of adjoining capacitors are isolated from one another.

With reference to FIGS. 8A and 8B, the filler layer 8 is removed down to the etching stop layer 2a located beneath it. Preferably, the p$^-$-silicon, which was serving only as a negative mold for the first electrodes, is then removed selectively with respect to the electrode material.

With reference to FIGS. 9A and 9B, a high-ε dielectric material or a ferroelectric material is deposited conformally, as a capacitor dielectric 10, on the exposed surface of the first electrode 9 which is obtained in this way. Next, the counter-electrode 11, which is made from a suitable conductive material (e.g. platinum, tungsten, titanium nitride), is applied.

FIGS. 9A and 9B also show further structures which are produced in the substrate and are present when the capacitor is used in a DRAM circuit. The first electrode 9L, 9S forms the so-called memory node for a storage capacitor. This first electrode is connected to a source/drain region 12 of a selection transistor by means of the contact 3 which is arranged beneath it and is provided with the diffusion barrier 4. The other source/drain region 12' of the selection transistor is connected to a buried bit line 15 via a bit line contact 14. Preferably, two adjacent memory cells have a common bit line contact. The buried bit line 15 and the bit line contact 14 are surrounded by the insulating layer 2. The channel region 16, a non-illustrated gate dielectric, and a gate electrode which acts as a word line 17 are arranged between the source/drain regions 12 and 12' of a selection transistor. The word line 17 and the bit line contact 14 are each formed from doped polysilicon. The bit line 15 is formed from doped polysilicon, tungsten silicide or tungsten. On that side of the S/D region 12 which is remote from the bit line 15, there is in each case an insulating structure, for example a shallow trench 18 which is filled with insulating material, in order to provide insulation between adjacent pairs of selection transistors.

We claim:

1. A process for producing a capacitor in a semiconductor configuration on a substrate, which comprises:

forming a sequence of layers on a substrate, the sequence alternately comprising a layer of a first material and a layer of a second material, wherein the first material is selectively etchable with respect to the second material;

etching the sequence of layers to form a layer structure with flanks;

forming a first auxiliary structure of a first auxiliary material covering at least one flank of the layer structure, wherein the first auxiliary structure is selectively etchable with respect to the second material;

forming a second auxiliary structure covering at least one other flank of the layer structure and mechanically connecting the layers of the second material;

covering a substrate surface surrounding the layer structure with a filler layer up to a top edge of the layer structure;

removing the layers of the first material and the first auxiliary structure selectively with respect to the layers of the second material and with respect to the second auxiliary structure;

filling a cavity formed in the removing step with a noble-metal-containing electrode material and forming a first electrode with lamellae in the cavity formed by the layers made from the first material and with a support structure connecting the lamellae in the cavity formed by the first auxiliary structure;

removing the layers of the second material and the second auxiliary structure selectively with respect to the electrode material;

conformally applying a capacitor dielectric of a material selected from the group consisting of high-$\epsilon$ dielectric and ferroelectric material to an exposed surface of the first electrode; and forming a second electrode on the capacitor dielectric.

2. The production process according to claim 1, which comprises selecting the first material from the group of materials consisting of undoped, n-doped, and p$^-$-doped polysilicon, and selecting p$^+$-doped polysilicon as the second material.

3. The production process according to claim 1, wherein the step of forming the first auxiliary structure comprises forming the first auxiliary structure on two flanks of the layer structure opposite one another in a first direction.

4. The production process according to claim 3, wherein the step of forming the second auxiliary structure comprises forming the second auxiliary structure on two flanks of the layer structure opposite one another in a second direction.

5. The production process according to claim 2, wherein at least one of the steps of forming the first auxiliary structure and forming the second auxiliary structure comprises a step of selective silicon deposition.

6. The production process according to claim 2, wherein the step of forming the second auxiliary structure comprises inclined implantation with p-doping ions into the flank of the layer structure.

7. The production process according to claim 1, which further comprises, subsequently to filling the cavity with the electrode material, removing the electrode material deposited on the filler layer with a CMP process.

8. The production process according to claim 1, which comprises, subsequently to forming the first electrode, removing the filler layer selectively with respect to the electrode material and with respect to the substrate surface.

9. The production process according to claim 1, which comprises providing the substrate with an insulating layer on a surface facing toward the sequence of layers and forming the sequence of layers on the insulating layer, wherein the insulating layer has a contact arranged therein comprising a diffusion barrier connected to the first electrode.

10. The production process according to claim 1, which comprises producing a multiplicity of capacitors in a linear arrangement along a second direction on the substrate, and thereby structuring the sequence of layers to strip-shaped layer structures running in the second direction, with the first auxiliary structures formed on the flanks of the structures;

structuring the strip-like layer structures, together with the first auxiliary structures, to form a multiplicity of island-like layer structures;

forming the second auxiliary structures on the flanks of each island opposite one another in the second direction; and filling an entire space between the islands with the filler layer.

* * * * *